United States Patent
Doris et al.

(10) Patent No.: US 8,013,367 B2
(45) Date of Patent: Sep. 6, 2011

(54) STRUCTURE AND METHOD FOR COMPACT LONG-CHANNEL FETS

(75) Inventors: Bruce B. Doris, Brewster, NY (US); Carl J. Radens, LaGrangeville, NY (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 11/937,161

(22) Filed: Nov. 8, 2007

(65) Prior Publication Data

US 2009/0121261 A1    May 14, 2009

(51) Int. Cl.
H01L 29/78 (2006.01)
H01L 21/336 (2006.01)
(52) U.S. Cl. .......... 257/288; 257/E21.409; 257/E29.255
(58) Field of Classification Search .................. 257/331, 257/E29.255, E27.112, E21.618, 327, 622, 257/E29.006, E29.007, E29.022, E29.024
See application file for complete search history.

(56) References Cited

U.S. PATENT DOCUMENTS

| | | | | |
|---|---|---|---|---|
| 5,429,965 A | * | 7/1995 | Shimoji | 438/287 |
| 6,127,702 A | | 10/2000 | Yamazaki et al. | |
| 6,300,221 B1 | * | 10/2001 | Roberds et al. | 438/435 |
| 7,053,400 B2 | * | 5/2006 | Sun et al. | 257/19 |
| 7,190,050 B2 | * | 3/2007 | King et al. | 257/622 |
| 7,265,008 B2 | * | 9/2007 | King et al. | 438/197 |
| 7,508,031 B2 | * | 3/2009 | Liu et al. | 257/331 |
| 7,605,449 B2 | * | 10/2009 | Liu et al. | 257/622 |
| 2005/0023645 A1 | * | 2/2005 | Shapira et al. | 257/595 |
| 2006/0255412 A1 | * | 11/2006 | Ramaswamy et al. | 257/368 |
| 2007/0004113 A1 | | 1/2007 | King et al. | |

OTHER PUBLICATIONS

International Search Report dated Jan. 6, 2009.

* cited by examiner

*Primary Examiner* — Jerome Jackson, Jr.
*Assistant Examiner* — David Spalla
(74) *Attorney, Agent, or Firm* — Scully, Scott, Murphy & Presser, P.C.; Katherine S. Brown, Esq.

(57) ABSTRACT

A compact semiconductor structure including at least one FET located upon and within a surface of a semiconductor substrate in which the at least one FET includes a long channel length and/or a wide channel width and a method of fabricating the same are provided. In some embodiments, the ordered, nanosized pattern is oriented in a direction that is perpendicular to the current flow. In such an embodiment, the FET has a long channel length. In other embodiments, the ordered, nanosized pattern is oriented in a direction that is parallel to that of the current flow. In such an embodiment, the FET has a wide channel width. In yet another embodiment, one ordered, nanosized pattern is oriented in a direction perpendicular to the current flow, while another ordered, nanosized pattern is oriented in a direction parallel to the current flow. In such an embodiment, a FET having a long channel length and wide channel width is provided.

16 Claims, 3 Drawing Sheets

STRUCTURE AND METHOD FOR COMPACT LONG-CHANNEL FETS

FIELD OF THE INVENTION

The present invention relates to a semiconductor structure and a method of fabricating the same. More particularly, the present invention relates to a compact field effect transistor (FET) having a long channel length and/or wide channel width associated therewith. The present invention also provides a method of forming such compact FETs utilizing self-assembled polymer technology.

BACKGROUND OF THE INVENTION

In the semiconductor industry, there is a constant demand to increase the operating speed of integrated circuits (ICs). This increased demand is fueled by the need for electronic devices such as computers to operate at increasingly greater speeds. The demand for increased speed, in turn, has resulted in a continual size reduction (i.e., compactness) of the semiconductor devices. Specifically, the channel length, junction depths, and/or gate dielectric thickness of field effect transistors (FETs) are reduced to provide a compact semiconductor structure.

Thus, there is a constant drive to reduce the size, or scale, of the components of a typical FET to increase the overall speed of the FET. Additionally, reducing the size, or scale, of the components of a typical FET also increases the density and number of FETs that can be fabricated on a given single semiconductor wafer.

However, reducing the channel length of a transistor also increases short-channel effects. Short-channel effects include, among other things, an increased source/drain (S/D) leakage current when the transistor is switched "off".

It is noted that short channel effects are relatively unimportant in long channel transistors. However, long channel FETs are generally difficult to fabricate into a compact structure since long channel FETs are restricted by the contact pitch.

In view of the above, there is a need to provide a semiconductor structure having a long channel length and/or wide-channel width without reduction in the design rule of the transistor. Moreover, a semiconductor structure including a long channel length and/or wide-channel width is needed within a fixed contact pitch without introducing shorting between the gate conductor and the source/drain contact regions. Furthermore, there is a need for providing a semiconductor structure including a long channel length and/or wide-channel width within a fixed contact pitch without decreasing the spacing between the source/drain contact region and the gate conductor and hence increasing the components of source/drain contact region-to-gate conductor coupling capacitance.

SUMMARY OF THE INVENTION

The present invention provides a compact semiconductor structure including at least one field effect transistor (FET) located upon and within a surface of a semiconductor substrate in which the at least one FET includes a long channel length and/or a wide channel width.

The term "channel length" as used herein denotes the area of the semiconductor substrate beneath the gate conductor which lays in a direction that is perpendicular to the current flow of the FET. The term "channel width" as used herein denotes the area of the semiconductor substrate that is located beneath the gate conductor in a direction that is parallel to the current flow. The term 'long' channel length as used herein denotes a channel length perpendicular to the current flow of about 30 nm or greater. Typically, the channel length is from about 35 to about 60 nm. The term 'wide' channel width denotes a channel width in the direction of the current flow that is about 200 nm or greater, with a channel width from about 300 to about 800 nm being more typical.

The inventive compact semiconductor structure is provided without reduction in the design rule of the transistor. Also, the inventive semiconductor structure is provided within a fixed contact pitch without introducing shorting between the gate conductor and the source/drain contact regions and without decreasing the spacing between the source/drain contact region and the gate conductor and hence increasing the components of source/drain contact region-to-gate conductor coupling capacitance. The inventive FET has a tighter distribution of on current, which results in more stable device performance.

In general terms, the inventive semiconductor structure includes:

at least one field effect transistor located upon and within a surface of a semiconductor substrate, said at least one field effect transistor having a channel within said semiconductor substrate located beneath a patterned gate conductor in which the channel has an ordered, nanosized pattern.

In some embodiments of the present invention the ordered, nanosized pattern is oriented in a direction that is perpendicular to the current flow. In such an embodiment, the FET has a long channel length associated therewith. In other embodiments of the present invention, the ordered, nanosized pattern is oriented in a direction that is parallel to that of the current flow. In such an embodiment, the FET has a wide channel width associated therewith. In yet another embodiment of the present invention, one ordered, nanosized pattern is oriented in a direction perpendicular to the current flow, while another ordered, nanosized pattern is oriented in a direction parallel to the current flow. In such an embodiment, a FET having a long channel length and wide channel width is provided.

The term "ordered, nanosized pattern" is used throughout the present application to denote a design having repeating structural units each of which has a width of about 50 nm or less. The ordered, nanosized pattern can be in the design of a line/space pattern in which each line and space has a width of about 50 nm or less.

The ordered, nanosized pattern that is present in the semiconductor substrate beneath the gate conductor increases the overall surface area of the channel without negatively impacting the compactness of the structure.

In addition to the above, the present invention also provides a method of fabricating such a semiconductor structure. In particular, the method of the present invention combines conventional CMOS processing with self-assembled polymer technology. The self-assembled polymer technology is used in forming an ordered, nanosized pattern within a region of the semiconductor substrate that will subsequently be used as a device channel.

In general terms, the inventive method comprises:

forming at least one ordered, nanosized pattern within at least one region of a semiconductor substrate;

forming at least a gate dielectric and a gate conductor on top of said at least one region of said semiconductor substrate including said at least one ordered, nanosized pattern; and forming source and drain diffusion regions in said semiconductor substrate in other regions of the semiconductor substrate that are adjacent to said at least one region of said semiconductor substrate including said at least one ordered, nanosized pattern.

In some embodiments of the present invention the ordered, nanosized pattern is oriented in a direction that is perpendicular to the current flow. In such an embodiment, the FET has a long channel length associated therewith. In other embodiments of the present invention, the ordered, nanosized pattern is oriented in a direction that is parallel to that of the current flow. In such an embodiment, the FET has a wide channel width associated therewith. In yet another embodiment of the present invention, one ordered, nanosized pattern is oriented in a direction perpendicular to the current flow, while another ordered, nanosized pattern is oriented in a direction parallel to the current flow. In such an embodiment, a FET having a long channel length and wide channel width is provided.

In the inventive method, a block copolymer is used to provide the ordered, nanosized pattern into the semiconductor substrate. The block copolymer, when placed and annealed on a planar surface, self-assemblies into an ordered array of multiple unit polymer blocks embedded in the polymeric matrix. The block copolymer of the present invention preferably comprises the first and second polymeric block components A and B at a weight ratio from about 80:20 to about 60:40.

Suitable block copolymers that can be used in the present invention include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

In a particular preferred, but not necessary, embodiment of the present invention, the block copolymer comprises PS-b-PMMA having a PS:PMMA weight ratio ranging from about 80:20 to about 60:40.

Annealing of the block copolymer layer is preferably, but not necessarily, conducted by either thermal annealing or ultra-violet light treatment.

DETAILED DESCRIPTION OF THE INVENTION

Figure 1:
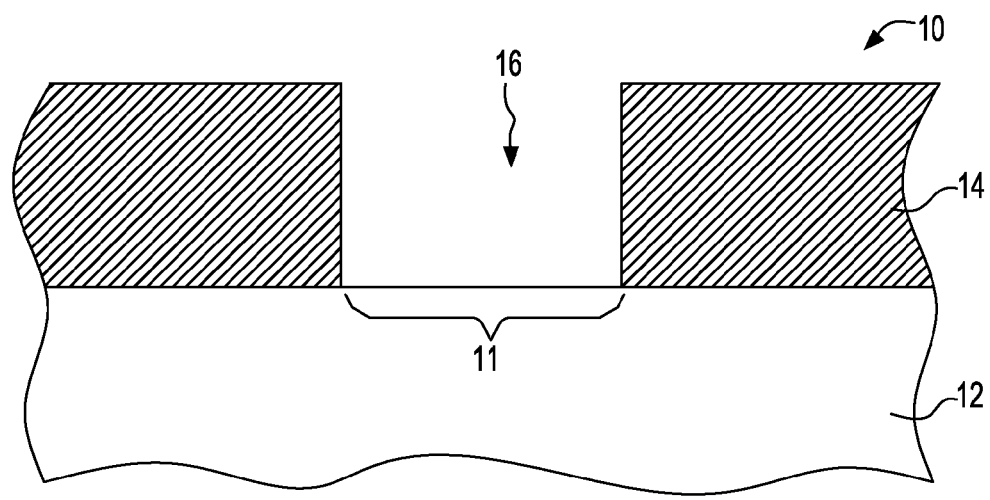
FIGS. 1-7 are pictorial representations (through cross sectional views) illustrating the basic processing steps of the present invention.

The present invention, which provides a semiconductor structure including a compact FET having a long channel length and/or wide-channel width as well as a method of fabricating the same, will now be described in greater detail by referring to the following description and drawings that accompany the present application. It is noted that the drawings of the present application are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present invention provides a semiconductor structure including at least one compact FET having a long channel length and/or wide channel width associated therein. The term "channel length" as used herein denotes the area of the semiconductor substrate beneath the gate conductor which lays in a direction that is perpendicular to the current flow of the FET. The term "channel width" as used herein denotes the area of the semiconductor substrate that is located beneath the gate conductor in a direction parallel to that of the current flow. The term 'long' channel length as used herein denotes a channel length perpendicular to the current flow of about 30 nm or greater. Typically, the channel length is from about 35 to about 60 nm. The term 'wide' channel width denotes a channel width in the direction of the current flow that is about 200 nm or greater, with a channel width from about 300 to about 800 nm being more typical.

Reference is now made to FIGS. 1-7 which illustrate an embodiment of the present invention for fabricating a compact FET including a long channel. Although this embodiment is specifically described and illustrated, the same processing steps as described herein below can be used in forming a compact FET having a wide channel width except that the patterned self-assembled polymers would be oriented with openings that are in the same direction as that of the current flow, rather than in a direction that is perpendicular to the current flow.

Reference is first made to FIG. 1 which illustrates an initial structure 10 that is formed in the present invention. The initial structure 10 includes a semiconductor substrate 12. Atop the semiconductor substrate 12 there is a sacrificial mandrel structure 14 which includes at least one opening 16 formed therein. The at least one opening 16 exposes a region 11 of the semiconductor substrate 10 in which the inventive device channel will be formed.

The semiconductor substrate 12 employed in the initial structure 10 comprises any semiconducting material including, but not limited to: Si, Ge, SiGe, SiC, SiGeC, Ge, GaAs, GaN, InAs, InP and all other III/V or II/VI compound semiconductors. Semiconductor substrate 12 may also comprise an organic semiconductor or a layered semiconductor such as Si/SiGe, a silicon-on-insulator (SOI), a SiGe-on-insulator (SGOI) or germanium-on-insulator (GOI). The substrate 12 may be comprised of one or more heterostructure layers such as (top-down) Si/Ge/SiGe, Ge/SiGe, Si/SiGe/Si, or SiGe/Si to serve as high-mobility channel layers. In some embodiments of the present invention, it is preferred that the semiconductor substrate 12 be composed of a Si-containing semiconductor material, i.e., a semiconductor material that includes silicon.

The semiconductor substrate 12 may be doped, undoped or contain doped and undoped regions therein. The semiconductor substrate 12 may include a single crystal orientation or it may include at least two coplanar surface regions that have different crystal orientations (the latter substrate is referred to in the art as a hybrid substrate). When a hybrid substrate is employed, an nFET is typically formed on a (100) crystal surface, while a pFET is typically formed on a (110) crystal plane. The hybrid substrate can be formed by techniques that are well known in the art.

The semiconductor substrate 12 may also include a first doped (n- or p-) region, and a second doped (n- or p-) region. For clarity, the doped regions are not specifically shown in the drawings of the present application. The first doped region and the second doped region may be the same, or they may have different conductivities and/or doping concentrations. These doped regions are known as "wells" and they are formed utilizing conventional ion implantation processes.

At least one isolation region (not shown) is typically present in the semiconductor substrate 12. The isolation region may be a trench isolation region or a field oxide isolation region. The trench isolation region is formed utilizing a conventional trench isolation process well known to those skilled in the art. The field oxide may be formed utilizing a so-called local oxidation of silicon process. Note that the at least one isolation region provides isolation between neighboring gate regions, typically required when the neighboring gates have opposite conductivities, i.e., nFETs and pFETs. The neighboring gate regions can have the same conductivity (i.e., both n- or p-type), or alternatively they can have different conductivities (i.e., one n-type and the other p-type).

The sacrificial mandrel structure 14 having the at least one opening 16 is then formed on a surface of the semiconductor substrate 12. In one embodiment, the sacrificial mandrel structure 14 having the at least one opening 16 is formed by deposition, lithography and etching. The deposition step, which forms a blanket layer of sacrificial mandrel material on the substrate, includes a conventional deposition process such as, for example, chemical vapor deposition (CVD), plasma enhanced chemical vapor deposition (PECVD), chemical solution deposition and physical vapor deposition (PVD). The lithographic step includes applying a photoresist (not shown) to the surface of the blanket layer of sacrificial mandrel material, exposing the photoresist to a desired pattern of radiation and developing the exposed resist. The etching step includes one of a dry etching process (e.g., reactive ion etching, ion beam etching, plasma etching or laser ablation) and a chemical wet etching process.

In an alternative embodiment, the patterned sacrificial mandrel 14 having the at least one opening 16 can be formed utilizing a replacement gate process in which a patterned polysilicon layer (not shown) is first formed on the surface of the semiconductor substrate 12. Thereafter, a blanket layer of the sacrificial mandrel material is deposition and etched backed. The patterned polysilicon is then removed providing the patterned sacrificial mandrel structure 14 having at least one opening 16 on the surface of the semiconductor substrate 12.

Notwithstanding which of the aforementioned embodiments is employed in forming the sacrificial mandrel structure 14 having at least one opening 16 on the surface of substrate 12, the sacrificial mandrel structure 14 comprises a sacrificial mandrel material which is typically a dielectric layer including, for example, an oxide, a nitride, an oxynitride, a spun-on glass, a polymer, a photoresist, and multilayers thereof. The thickness of the sacrificial mandrel structure 14 may vary depending on the mandrel material as well as the deposition technique that was used in forming the same. Typically, the thickness of the sacrificial mandrel structure 14 is from about 10 nm to about 500 nm, with a thickness from about 50 to about 300 nm being even more typical.

The width of the at least one opening 16 that is present in the sacrificial mandrel structure 14 is typically within lithographic limits since lithography is involved in forming the same. Thus, for example, the width of the at least one opening 16 is typically about 50 nm or greater, with a width from about 55 to about 70 nm being even more typical.

A layer of a self-assembled block copolymer is applied within the at least one opening 16 shown in FIG. 1 and then annealed to form an ordered pattern containing repeating structural units. The height of the layer of self-assembled block copolymer has a thickness that is substantially the same as the thickness of the sacrificial mandrel structure 14. Thus, the self-assembled block copolymer does not extend above the uppermost surface of the sacrificial mandrel structure 14. The sidewalls of the sacrificial mandrel structure 14 defining the at least one opening 16 serve as a placeholder material for retaining the block copolymer within the area that is required to be patterned.

There are many different types of block copolymers that can be used for practicing the present invention. As long as a block copolymer contains two or more different polymeric block components that are not miscible with one another, such two or more different polymeric block components are capable of separating into two or more different phases on a nanometer scale and thereby form patterns of isolated nano-sized structural units under suitable conditions.

In a preferred, but not necessary, embodiment of the present invention, the block copolymer consists essentially of first and second polymeric block components A and B that are immiscible with each other. The block copolymer may contain any numbers of the polymeric block components A and B arranged in any manner. The block copolymer can have either a linear or a branched structure. Preferably, such a block polymer is a linear diblock copolymer having the formula of A-B. Further, the block copolymer can have any one of the following formula:

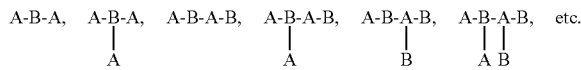

Specific examples of suitable block copolymers that can be used for forming the structural units of the present invention may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

The specific structural units formed by the block copolymer are determined by the molecular weight ratio between the first and second polymeric block components A and B. For example, when the ratio of the molecular weight of the first polymeric block component A over the molecular weight of the second polymeric block component B is greater than about 80:20, the block copolymer will form an ordered array of spheres composed of the second polymeric block component B in a matrix composed of the first polymeric block component A. When the ratio of the molecular weight of the first polymeric block component A over the molecular weight of the second polymeric block component B is less than about 80:20 but greater than about 60:40, the block copolymer will form an ordered array of cylinders composed of the second polymeric block component B in a matrix composed of the first polymeric block component A. When the ratio of the molecular weight of the first polymeric block component A over the molecular weight of the second polymeric block component B is less than about 60:40 but is greater than about 40:60, the block copolymer will form alternating lamellae composed of the first and second polymeric block components A and B. Therefore, the molecular weight ratio between the first and second polymeric block components A and B can be readily adjusted in the block copolymer of the present invention, in order to form desired structural units.

In a preferred embodiment of the present invention, the ratio of the molecular weight of the first polymeric block component A over the molecular weight of the second polymeric block component B ranges from about 80:20 to about 60:40, so that the block copolymer of the present invention will form an ordered array of lines composed of the second polymeric block component B in a matrix composed of the first polymeric block component A.

Preferably, one of the components A and B can be selectively removable relative to the other, thereby resulting in either isolated and orderly arranged structural units composed of the un-removed component, or a continuous structural layer containing isolated and orderly arranged cavities or trenches left by the removable component.

Figure 2:
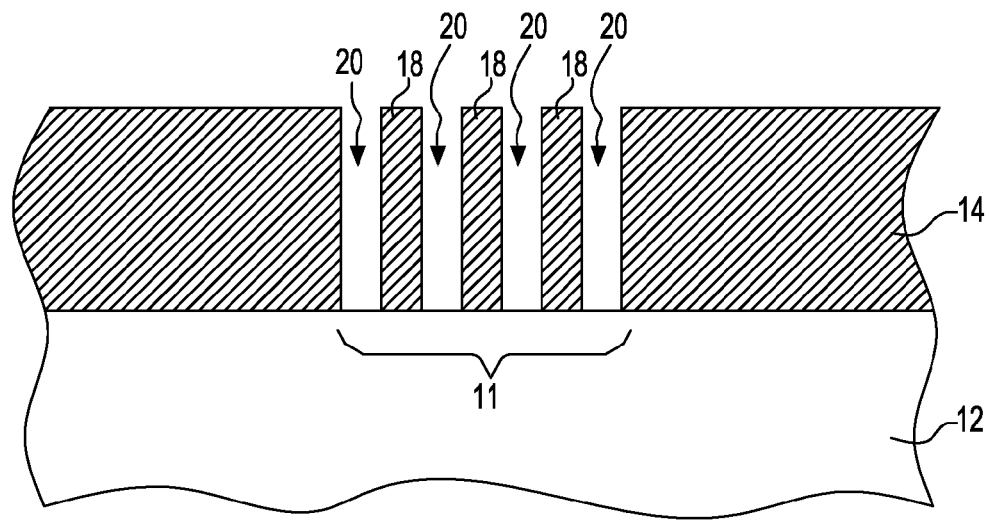

In FIG. 2, the unremovable component of the block copolymer is labeled as reference numeral 18, while the trenches created by the removable component of the block copolymer is labeled as reference numeral 20. It is noted that although the instant embodiment illustrates the formation of a line/space pattern, the present invention is not limited to the same. Since self-assembled block copolymers are used in the inventive method each repeating unit has a width of about 50 nm or less. Other types of patterns that can be patterned/formed include, for example, spheres, cylinders, or lamellae.

In a particularly preferred embodiment of the present invention, the block copolymer used for forming the self-assembled periodic patterns of the present invention is PS-b-PMMA with a PS:PMMA molecular weight ratio ranging from about 80:20 to about 60:40.

Typically, mutual repulsion between different polymeric block components in a block copolymer is characterized by the term $\chi N$, where $\chi$ is the Flory-Huggins interaction parameter and N is the degree of polymerization. The higher $\chi N$, the higher the repulsion between the different blocks in the block copolymer, and the more likely the phase separation therebetween. When $\chi N > 10$ (which is hereinafter referred to as the strong segregation limit), there is a strong tendency for the phase separation to occur between different blocks in the block copolymer.

For a PS-b-PMMA diblock copolymer, $\chi$ can be calculated as approximately $0.028 + 3.9/T$, where T is the absolute temperature. Therefore, $\chi$ is approximately 0.0362 at 473K ($\approx 200°$ C.). When the molecular weight ($M_n$) of the PS-b-PMMA diblock copolymer is approximately 64 Kg/mol, with a molecular weight ratio (PS:PMMA) of approximately 66:34, the degree of polymerization N is about 622.9, so $\chi N$ is approximately 22.5 at 200° C.

In this manner, by adjusting one or more parameters such as the composition, the total molecular weight, and the annealing temperature, the mutual compulsion between the different polymeric block components in the block copolymer of the present invention can be readily controlled to effectuate desired phase separation between the different block components. The phase separation in turn leads to formation of self-assembled periodic patterns containing ordered arrays of repeating structural units (i.e., spheres, lines, cylinders, or lamellae), as described hereinabove.

In order to form the self-assembled periodic patterns, the block copolymer is first dissolved in a suitable solvent system to form a block copolymer solution, which is then applied onto a surface to form a thin block copolymer layer, followed by annealing of the thin block copolymer layer, thereby effectuating phase separation between different polymeric block components contained in the block copolymer.

The solvent system used for dissolving the block copolymer and forming the block copolymer solution may comprise any suitable solvent, including, but not limited to: toluene, propylene glycol monomethyl ether acetate (PGMEA), propylene glycol monomethyl ether (PGME), and acetone. The block copolymer solution preferably contains the block copolymer at a concentration ranging from about 0.1% to about 2% by total weight of the solution. More preferably, the block copolymer solution contains the block copolymer at a concentration ranging from about 0.5 wt % to about 1.5 wt %. In a particularly preferred embodiment of the present invention, the block copolymer solution comprises about 0.5 wt % to about 1.5 wt % PS-b-PMMA dissolved in toluene or PGMEA.

The block copolymer solution can be applied to the surface of a device structure by any suitable techniques, including, but not limited to: spin casting, coating, spraying, ink coating, dip coating, etc. Preferably, the block copolymer solution is spin cast onto the surface of a device structure to form a thin block copolymer layer thereon.

After application of the thin block copolymer layer onto the device surface, the entire device structure is annealed to effectuate micro-phase segregation of the different block components contained by the block copolymer, thereby forming the periodic patterns with repeating structural units.

The annealing of the block copolymer can be achieved by various methods known in the art, including, but not limited to: thermal annealing (either in a vacuum or in an inert atmosphere containing nitrogen or argon), ultra-violet annealing, laser annealing, solvent vapor-assisted annealing (either at or above room temperature), and supercritical fluid-assisted annealing, which are not described in detail here in order to avoid obscuring the invention.

In a particularly preferred embodiment of the present invention, a thermal annealing step is carried out to anneal the block copolymer layer at an elevated annealing temperature that is above the glass transition temperature ($T_g$) of the block copolymer, but below the decomposition or degradation temperature (Td) of the block copolymer. More preferably, the thermal annealing step is carried out an annealing temperature of about 200° C.-300° C. The thermal annealing may last from less than about 1 hour to about 100 hours, and more typically from about 1 hour to about 15 hours.

In an alternative embodiment of the present invention, the block copolymer layer is annealed by ultra-violet (UV) treatment.

Following the anneal process, one of the components of the block copolymer can be removed utilizing a solvent that is selective to that component relative to the other component of the block copolymer.

Figure 3:
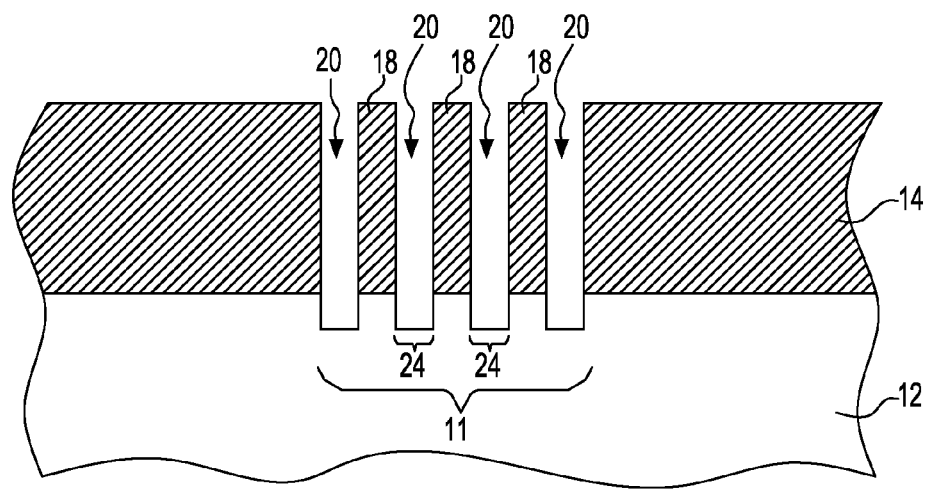
Figure 4:
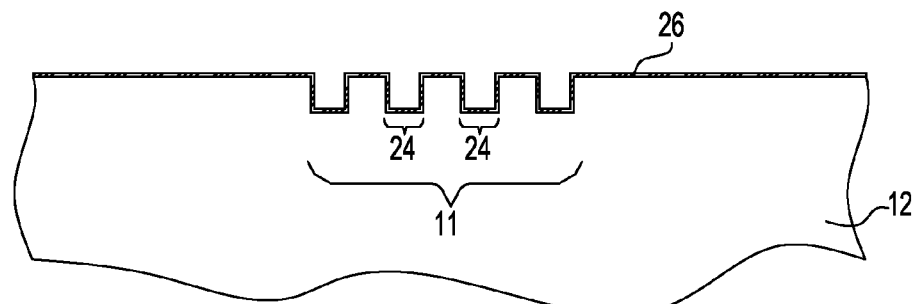

After removing the removable component of the block copolymer, the remaining "unremovable" component 18 serves as an etch mask. Etching is then performed to extend the trenches 20 or other patterns into the region 11 of semiconductor substrate 12. The resultant structure that is formed after extending the trenches is shown, for example, in FIG. 3. Typically, etching is performed utilizing a dry etching process such as, for example, reactive ion etching, ion beam etching, plasma etching or laser ablation. In FIG. 3, reference numeral 24 denotes a single patterned repeating unit that was been etched into region 11 of the semiconductor substrate 12.

Since self-assembled polymer technology is used in the inventive process, the width, W, of each single repeating unit 24 is less than 50 nm, with a width from about 10 to about 40 nm being more typical. That is, region 11 of the semiconductor substrate 12 now includes an ordered, nanosized pattern represented by single repeating units 24 that have a nanosized width. Each single repeating unit is separated by a trench also having a nanosized width. The ordered, nanosized pattern is present in the device channel region of the structure.

After forming the structure shown in FIG. 3, the sacrificial mandrel structure 14 and the unremovable polymeric component 18 of the block copolymer are removed utilizing a conventional planarization process such as chemical mechanical polishing and/or grinding. In some embodiments, various etching process can be used to remove the sacrificial mandrel structure 14 and the unremovable polymer component 18.

An oxide or oxynitride layer (not shown) is optionally formed on the surface of the semiconductor substrate 12. The optional oxide or oxynitride layer is formed utilizing a conventional growing technique that is well known to those skilled in the art including, for example, oxidation or oxynitridation. The oxide or oxynitride layer is comprised of silicon oxide, silicon oxynitride or a nitrided silicon oxide. When present, the optional oxide or oxynitride layer has a thickness that is typically from about 0.5 to about 1.2 nm, with a thickness from about 0.8 to about 1 nm being more typical. In accordance with an embodiment of the present invention, the optional oxide or oxynitride layer is a silicon oxide layer having a thickness from about 0.6 to about 0.8 nm that is formed by low-temperature (less than 750° C.) oxidation. The process step for this oxidation includes a rapid thermal process.

Next, a gate dielectric 26 is formed on the surface of the oxide or oxynitride layer, if present, or directly on the surface of the semiconductor substrate 12, if the optional oxide or oxynitride layer is not present, by a conventional deposition process and/or a thermal growing process. The resultant structure including the gate dielectric 26 located on the surface of semiconductor substrate 12 is shown, for example, in FIG. 4. It is noted that the gate dielectric 26 forms within region 11 which includes the ordered, nanosized pattern therein.

The gate dielectric 26 comprises any insulating oxide, nitride and/or oxynitride, with oxide containing gate dielectrics being highly preferred. The gate dielectric 26 may include silicon dioxide, silicon nitride or silicon oxynitride. In addition, the gate dielectric 26 employed in the present invention may include a metal oxide, a metal silicide, a metal silicon oxynitride and/or a mixed metal oxide. Examples of metal-containing dielectrics include $TiO_2$, $Al_2O_3$, Zr-based dielectrics, Hf-based dielectrics, $Ta_2O_5$, $La_2O_3$, perovskite-type oxides and other like dielectric materials. The term 'Hf-based dielectric' denotes hafnium oxide ($HfO_2$), hafnium silicate ($HfSiO_x$), Hf silicon oxynitride (HfSiON) or multilayers thereof. In some embodiments, the Hf-based dielectric comprises a mixture of $HfO_2$ and $ZrO_2$. The physical thickness of the gate dielectric 26 may vary, but typically, the gate dielectric 26 has a thickness from about 0.5 to about 10 nm, with a thickness from about 0.5 to about 3 nm being more typical.

In one embodiment of the present invention, the gate dielectric 26 is formed by a conventional deposition process including, for example, CVD, PECVD, chemical solution deposition, atomic layer deposition (ALD), evaporation and PVD. Alternatively, the gate dielectric 26 is formed by a thermal process including, for example, oxidization, nitridration and oxynitridation.

Figure 5:
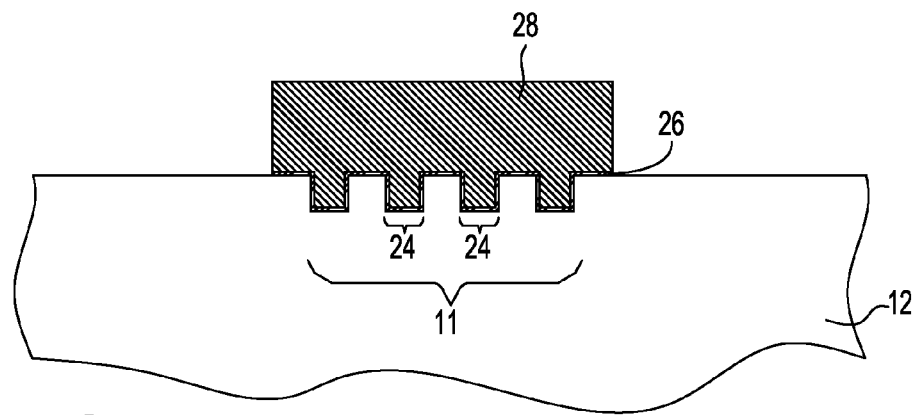

Atop the gate dielectric 26, and as shown in FIG. 5, is a patterned gate conductor 28. The patterned gate conductor 28 comprises any conductive material, including, for example, doped polysilicon, doped silicon germanium, a metal, a metal alloy, a metal silicide, a metal nitride and multilayered stacks thereof. In one embodiment, the patterned gate conductor 28 is doped polysilicon. The thickness of the patterned gate conductor 28 that is formed may vary depending on the method used in forming, i.e., depositing, the same. Typically, the patterned gate conductor 28 has a thickness from about 20 nm to about 200 nm, with a thickness from about 60 nm to about 120 nm being even more typical.

The patterned gate conductor 28 is formed utilizing a conventional deposition process, lithography and etching. Suitable deposition processes that can be used to deposit a blanket layer of gate conductor material include CVD, PECV, sputtering, plating, chemical solution deposition and evaporation. In some embodiments in which a metal silicide is used as the gate conductor, a conventional silicide process can be used. The gate conductor may, in some embodiments, be doped with an n-type dopant atom or a p-type dopant atom. The dopant atoms may be introduced during the deposition of the conductive material utilizing an in-situ doping deposition process. Alternatively, the dopant atoms may be introduced to the blanket layer of the gate conductor material by ion implantation and/or gas phase doping.

The lithographic step includes the process described above for forming the at least one opening 16 into the blanket layer of sacrificial mandrel material. The etching step including a dry etching process (reactive ion etching, plasma etching, ion beam etching or laser ablation) and/or a wet chemical etching process. It is noted that during this etching process, exposed portions of the gate dielectric 26 may also be etched. FIG. 5 illustrates an embodiment in which the exposed portions of the gate dielectric 26 that are not protected are removed. After etching, the photoresist used in patterning the blanket layer of gate conductor material is removed utilizing a conventional stripping process.

In some embodiments of the present invention, a dielectric cap (not shown), i.e., hard mask, may be present atop the patterned gate conductor 28. When present, the dielectric cap typically comprises an oxide, such a silicon oxide, silicon nitride, or combinations thereof, and it has a thickness from about 5 nm to about 50 nm. The dielectric cap can be used to prevent formation of a metal semiconductor alloy atop the gate conductor.

Figure 6:
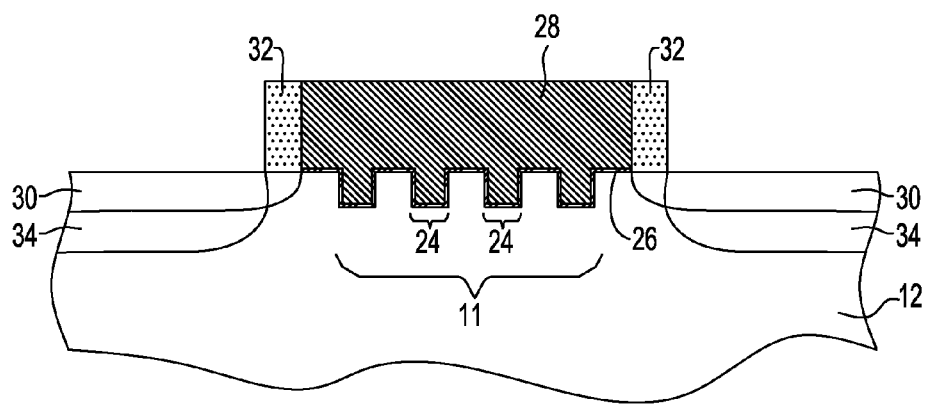

FIG. 6 shows the structure of FIG. 5 after further CMOS processing steps have been performed. Specifically, FIG. 6 includes source/drain extension regions 30, at least one sidewall spacer 32, and source/drain diffusion regions 34. The extension regions 30 are typically formed utilizing an ion implantation process well known to those skilled in the art. Typically, the extension implantation is performed in the absence of sidewall spacers such that the inner edge of the extension region is aligned to the outer edge of the patterned gate conductor. After this ion implantation step, an optional anneal process may be performed to active the dopants that are implanted during the ion implantation process. The anneal may also be performed later on in the inventive process. For example, after ion implantation of the source/drain diffusion regions or during the metal semiconductor alloy formation.

The at least one sidewall spacer 32 is then typically, but not necessarily always, formed on at least the exposed sidewalls of the patterned gate conductor 28. The at least one spacer 32 is formed by deposition and etching. The at least one spacer 32 comprises any insulating material including, for example, an oxide, a nitride, an oxynitride and any combination thereof, e.g., oxide/nitride or nitride/oxide.

Next, the source/drain diffusion regions 34 are formed into the surface of the semiconductor substrate 12 utilizing a conventional ion implantation process. Halo implants may optionally be performed at this time of inventive process. Following the formation of the source/drain diffusion regions 34, an anneal process may be used to active the dopants that were implanted into the semiconductor substrate 12. The anneal may also be delayed and can be performed during a later thermal event of the inventive process, e.g., during formation of the metal semiconductor alloy.

Figure 7:
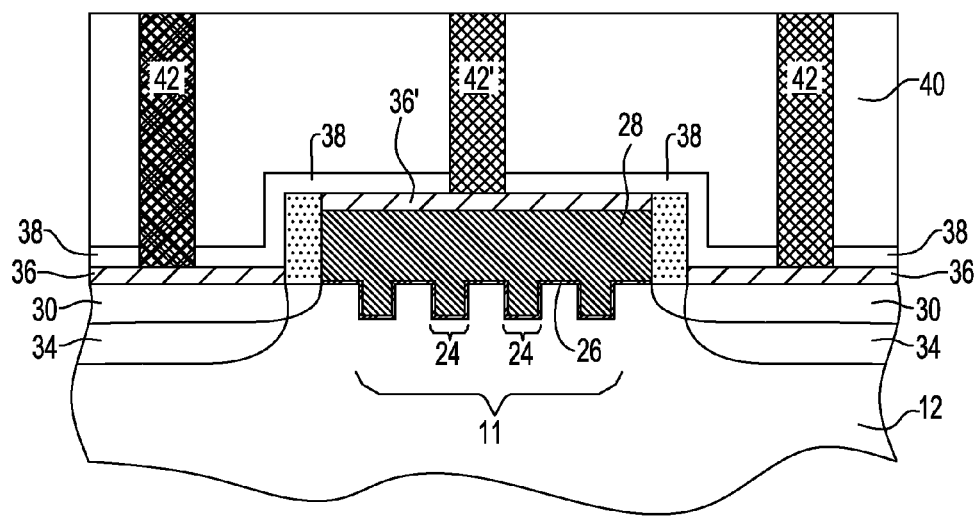

Next, and as shown in FIG. 7, a metal semiconductor alloy layer 36 is formed on the source/drain diffusion regions 34 that were previously formed therein. The term "metal semiconductor alloy" is used herein to denote a reaction product that is formed from thermally reacting a metal with a semiconductor material. For example, the term "metal semiconductor alloy" can be used to describe a metal silicide wherein the metal is one of Ti, W, Co, Ni, Pt, Pd Ta and Ru. Typically, the metal is one of Ti, W, Co and Ni. The term "metal semiconductor alloy" also describes a metal germanide including one of the above metals.

The metal semiconductor alloy layer 36 is formed by first depositing a metal that is capable of thermally reacting with a semiconductor material atop the structure shown in FIG. 6. The metal is typically one of Ti, W, Co, Ni, Pt and Pd, with one of Ti, W, Co and Ni being more preferred. The metal may include an alloying additive such as, for example, C, Al, Si, Sc, Ti, V, Cr, Mn, Fe, Co, Ni, Cu, Ge, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho Tm, Yb, Lu and mixtures thereof. When present, the alloying additive is present in amounts up to about 50 atomic percent. The metal is formed by a conventional deposition process including, for example, chemical vapor deposition, plasma enhanced chemical vapor deposition, plating, sputtering, chemical solution deposition, atomic layer deposition, physical vapor deposition and other like techniques. The alloying additive can be formed at the same time as the metal or it can be adding to the metal after deposition thereof, or it can be co-deposited atop the metal in a separate layer.

The thickness of the deposited metal can vary depending on the technique used in depositing the same. Typically, and for applications in FETs, the metal that is deposited has a thickness from about 3 nm to about 10 nm.

Following formation of the metal, an optional diffusion barrier such as TiN or TaN may be formed atop the metal prior to annealing. Annealing is performed under conditions that are sufficient in causing the metal and semiconductor to react together forming a metal semiconductor alloy layer, i.e., a metal silicide or a metal germanide. The anneal may be performed in a single step or a two-step anneal process can be used. The anneal is performed at a temperature of about 300° C. or greater, with a temperature from about 400° to about 700° C. being more typical. The optional diffusion barrier is removed after the single anneal process or after the first anneal of the two-step anneal utilizing a conventional process well known to those skilled in the art. Annealing can be performed in a forming gas, He, Ar, or $N_2$. The anneal includes a furnace anneal, a rapid thermal anneal, a spike anneal, a microwave anneal or a laser anneal. Following the final anneal step, any unreacted metal is removed from the structure.

Note that when the patterned gate conductor 28 is composed of a Si-containing conductive material, i.e., polysilicon or silicon germanium, a metal semiconductor alloy layer 36' can also form on an upper surface of the patterned gate conductor 28. In embodiments in which a diffusion cap is present and remains on the structure during the formation of the metal semiconductor alloy layer, no such layer is formed atop the patterned gate conductor 28.

A dielectric liner 38 comprising an oxide, nitride, oxynitride or combination thereof is typically, but not necessarily always, formed over the structure including the metal semiconductor alloy layer 36; See FIG. 7. The dielectric liner 38 can be used to introduce stress into the device channel; the device channel, as is known to those skilled in the art, is the region 11 of the semiconductor substrate that is beneath the gate conductor which is laterally confined by the device's source region on one side, and by the device's drain region on the other side. The dielectric liner 38 is formed utilizing a conventional deposition well known to those skilled in the art and the thickness of the dielectric liner is typically from about 10 nm to about 200 nm.

Next, an interconnect dielectric material 40 is formed by deposition (typically by chemical vapor deposition, plasma enhanced chemical vapor deposition or spin-on coating) and openings are formed into the interconnect dielectric material 40 by lithography and etching. The interconnect dielectric material 40 includes any dielectric material having a dielectric constant, relative to vacuum, that is about 4.0 or less. Some examples of suitable dielectrics that can be used as the interconnect dielectric material 40 include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The openings are typically lined with a diffusion barrier material such as, for example, Ti, Ta, W TaN, TiN or WN, and thereafter the openings are filled (by, for example, plating) with a conductive material such as for example, W, Al, Cu or a AlCu alloy. The openings that extend to the source/drain diffusion regions are referred to as the diffusion contacts and they are labeled in the drawings by reference numeral 42. A contact to the gate conductor 42' is typically also formed. The resultant structure that is formed after the above steps of dielectric liner formation, and interconnect formation is shown, for example, in FIG. 7.

It should be noted that although the above description and illustrations in FIGS. 1-7 show the presence of a single patterned gate conductor (and hence a single FET), the presence invention works equally well when a plurality of gate conductors (and hence FETs) are present.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A semiconductor structure comprising:
at least one field effect transistor located upon and within a surface of a semiconductor substrate, said at least one field effect transistor having a channel within said semiconductor substrate located beneath a patterned gate conductor in which the channel has an ordered, nanosized pattern defined by a plurality of openings presented within the semiconductor substrate in which each opening is separated from another opening by an unetched portion of the semiconductor substrate, wherein each opening and said unetched portion of the semiconductor substrate have a width of less than 50 nm, and wherein a gate dielectric of said at least one field effect transistor is located on sidewalls and a bottom wall of each of said plurality of openings and on an upper surface of the semiconductor substrate between each of said plurality of openings, and said gate dielectric not completely filling each of said plurality of openings, and further wherein said patterned gate conductor includes a lower portion that is present in each of said plurality of openings and an upper portion that extends above each of said plurality of openings.

2. The semiconductor structure of claim 1 wherein said ordered, nanosized pattern is oriented in a direction that is perpendicular to current flow.

3. The semiconductor structure of claim 1 wherein said ordered, nanosized pattern is oriented in a direction that is parallel to that of current flow.

4. The semiconductor structure of claim 1 wherein said ordered, nanosized pattern includes a first ordered, nanosized patterned oriented in a direction perpendicular to current flow, and a second ordered, nanosized pattern oriented in a direction parallel to current flow.

5. The semiconductor structure of claim 1 wherein said gate dielectric is positioned between said channel and said patterned gate conductor.

6. The semiconductor structure of claim 1 further comprising a source diffusion region and a drain diffusion region located in said semiconductor substrate on opposing sides of said channel.

7. The semiconductor structure of claim 6 further comprising a metal semiconductor alloy located atop said source diffusion region and said drain diffusion region.

8. The semiconductor structure of claim 7 further comprising a dielectric liner located on said metal semiconductor alloy and said at least one field effect transistor.

9. The semiconductor structure of claim 8 wherein said dielectric liner introduces a stress into said channel.

10. The semiconductor structure of claim 8 further comprising an interconnect dielectric material located on said dielectric liner, said interconnect dielectric material having conductively filled vias that extend to said semiconductor metal alloy.

11. A semiconductor structure comprising:
at least one field effect transistor located upon and within a surface of a semiconductor substrate, said at least one field effect transistor having a channel within said semiconductor substrate located beneath a patterned gate conductor in which the channel has an ordered, nanosized pattern defined by a plurality of openings presented within the semiconductor substrate substrate in which each opening is separated from another opening by an unetched portion of the semiconductor substrate, wherein each opening and said unetched portion of the semiconductor substrate have a width of less than 50 nm, said ordered, nanosized pattern is oriented in a direction that is perpendicular to current flow, and wherein a gate dielectric of said at least one field effect transistor is located on sidewalls and a bottom wall of each of said plurality of openings and on an upper surface of the semiconductor substrate between each of said plurality of openings, and said gate dielectric not completely filling each of said plurality of openings, and further wherein said patterned gate conductor includes a lower portion that is present in each of said plurality of openings and an upper portion that extends above each of said plurality of openings.

12. The semiconductor structure of claim 11 further comprising a source diffusion region and a drain diffusion region located in said semiconductor substrate on opposing sides of said channel.

13. The semiconductor structure of claim 12 further comprising a metal semiconductor alloy located atop said source diffusion region and said drain diffusion region.

14. The semiconductor structure of claim 13 further comprising a dielectric liner located on said metal semiconductor alloy and said at least one field effect transistor.

15. The semiconductor structure of claim 14 wherein said dielectric liner introduces a stress into said channel.

16. The semiconductor structure of claim 14 further comprising an interconnect dielectric material located on said dielectric liner, said interconnect dielectric material having conductively filled vias that extend to said semiconductor metal alloy.

* * * * *